United States Patent [19]

Partin et al.

[11] Patent Number: 4,900,687
[45] Date of Patent: Feb. 13, 1990

[54] PROCESS FOR FORMING A MAGNETIC FIELD SENSOR

[75] Inventors: Dale L. Partin, Sterling Heights; Joseph P. Heremans, Troy, both of Mich.

[73] Assignee: General Motors Corporation, Detroit, Mich.

[21] Appl. No.: 331,720

[22] Filed: Apr. 3, 1989

Related U.S. Application Data

[63] Division of Ser. No. 181,758, Apr. 14, 1988, Pat. No. 4,843,444

[51] Int. Cl.$^4$ .............................................. H01L 27/22
[52] U.S. Cl. ........................................ 437/27; 437/38
[58] Field of Search .................. 437/27, 38, ; 357/27, 357/55, 63

[56] References Cited

U.S. PATENT DOCUMENTS 3,714,523  1/1973  Bate ........................................ 357/27
3,747,201  7/1973  Hrai ........................................ 357/27

OTHER PUBLICATIONS

IBM Tech. Disclosure Bulletin, vol. 28, No. 9, Feb. 1986, pp. 4074–4076.
Cristoloveanu et al., "Magnetodiodes on Silicon on Sapphire: A New Kind of Microelectronics Magnetic Sensors", 4th European Conference on Electro Technics, pp. 657–659, Germany 24–28, Mar. 1980.

*Primary Examiner*—Olik Chaudhuri
*Assistant Examiner*—Tuan Nguyen
*Attorney, Agent, or Firm*—Robert J. Wallace

[57] ABSTRACT

A magnetic sensor is formed by a diode that includes a silicon element whose bulk is of high resistivity and low recombination velocity material and which includes spaced apart on its top surface n-type and p-type zones to which are provided electrical terminals. The element is treated to form at the top surface regions of high recombination velocity so located that when a voltage is applied between the electrical terminals to establish a flow of minority charge carriers between the p-type and n-type zones, such flow, in the absence of an applied magnetic field to be sensed, is little affected by the surface regions of high recombination velocity, but in the presence of any such field, is deflected into such surface regions and extinguished. Advantagously, the surface regions are formed by etching to form grooves and then ion implanting the grooved regions.

2 Claims, 4 Drawing Sheets

PROCESS FOR FORMING A MAGNETIC FIELD SENSOR

This is a division of Ser. No. 181,758, filed 4/14/88, now U.S. Pat. No. 843,444.

FIELD OF THE INVENTION

This invention relates to a device for sensing the strength of a magnetic field and to a process for manufacturing such a magnetic sensor.

BACKGROUND OF THE INVENTION

The magnetoresistance effect, the phenomenon in which the resistance of an element of certain materials increases with applied magnetic field normal to the direction of current flow in the element, has long been known. This effect depends on the Lorenz force that tends to deflect charge carriers (holes and electrons) moving in an appropriate material, such as a semiconductive crystal, in an electric field and a transverse magnetic field, and is sometimes described as the Hall effect.

A variety of devices have been proposed based on this effect and a paper entitled "Recent Development of Magnetoresistive Devices and Applications" published by Shoer Kataoka in *The Circulars of the Electrotechnical Laboratory*, No. 182 (December, 1974) describes a number of such devices and their basic principles. In particular, there are described therein magnetodiodes using silicon and germanium. A magnetodiode typically is formed by locating heavily doped p-type and n-type regions spaced apart in a top surface of a lightly doped crystal of silicon and lapping the bottom surface of the crystal to make such bottom surface a high recombination velocity region, i.e., a region where charge carriers of one sign readily recombine with charge carriers of the opposite sign and so both become no longer available for use in conduction. With such a device, the magnetic field to be sensed is made to deflect injected charge carriers into a recombination region whereby the resistance measured between the p-type and n-type regions is reduced because of the fewer charge carriers flowing between the two regions.

In the prior art, some devices of this kind have used a silicon element that is relatively thin, typically no greater than about thirty microns, and whose back surface has been lapped to form the recombination region. Such devices are not readily produced on a mass production basis and so tend to be expensive. Alternatively, other devices of this kind have involved a silicon element grown on a sapphire substrate in which the silicon-sapphire interface is used as a region of high recombination velocity.

A magnetic field being sensed is made to deflect injected carriers towards this interface for recombination so that the number effective for conduction is correspondingly reduced. Devices of this kind are described by A. Chovet et al, in an article entitled "Noise Limitations of Magnetodiodes," *Sensors and Activators* 4, 1983, pages 147–150 (based on a paper presented at Solid-State Transducers 83, Delft, The Netherlands, May 31–June 3, 1983) and in an article by 0. S. Lutes et al, entitled "Sensitivity Limits SOS Magnetodiodes," *IEEE Transaction on Electron Devices*, ED-27, 1980, pages 2156 and 2157. Such devices tend to be complex and expensive because they involve silicon-on-sapphire technology.

As another alternative, silicon magnetic sensors have been formed composed of two integrated PIN diodes in which a magnetic field being sensed is made to deflect carriers from flowing in one diode to the other diode (see letter by M. Kimura and S. Takahashi entitled "Si Magnetic sensor Composed of Two Combined PIN Diodes," *Electronic Letters*, 31st, July, 1986, Vol. 22 No. 16). This usually adds to the circuit complexity.

It is desirable to have a magnetodiode, typically of silicon, that can be made using relatively conventional silicon integrated circuit processing techniques, and as such is capable of mass production at low cost.

SUMMARY OF THE INVENTION

A magnetodiode in accordance with an illustrative embodiment of the invention includes a semiconductive element, typically monocrystalline silicon of relatively high resistivity and high charge carrier mobility, that includes a bulk portion where the recombination rate of carriers of opposite sign is relatively low. It also preferably includes at least one portion that is relatively deep and localized at a front surface that has been damaged, typically by ion implantation, to be a region where the recombination rate is much higher. Additionally a pair of localized p-type and n-type doped regions are included, preferably both also localized on the front surface of the element, such that when a voltage is applied between the two doped regions to inject a flow of hole and electron charge carriers between such regions, in the absence of a magnetic field in the element, such flow is relatively unimpeded by the damaged region. However, in the presence of a magnetic field in a direction normal to that of the flow, at least a portion of such flow is intercepted by the damaged region and such carriers recombine there and so no longer participate in conduction. A variety of other geometries are also proposed to enhance the sensitivity of the diode. Some include grooves in the top surface to facilitate the formation of damaged regions of high recombination velocity for charge carriers.

The invention will be better understood from the following more detailed description taken in conjunction with the accompanying drawings.

DETAILED DESCRIPTION

Figure 1A:
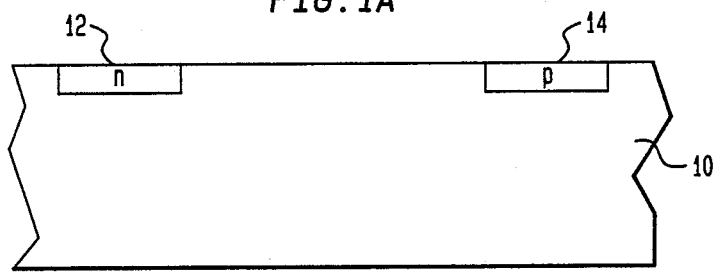
FIGS. 1A and 1B are cross-sectional views of sections of a silicon workpiece (wafer) at different stages of processing into a magnetodiode in accordance with an illustrative embodiment of the invention.

Referring now to FIG. 1A, there is shown a cross-sectional view of a portion of a semiconductor slice or wafer 10, typically of monocrystalline silicon whose bulk is essentially free of doping to be of high resistivity, for example, having a room temperature resistivity of about 1000 ohms-centimeter or larger (of either conductivity type), so that there are few free carriers for conduction in the absence of injected carriers. Included along a top surface of the element 10 are low resistivity n-type region 12 and low resistivity p-type region 14 spaced apart between 10 and 150 microns, and preferably about 50 microns. These regions may be formed in conventional fashion, for example, by diffusion or ion implantation of suitable donor or acceptor dopants. Photolithographic techniques can be used for localizing the regions to desired surface areas. The depths of the regions are not especially critical but values in the range of a few tenths of a micron to a few microns are typical. Typically, the doping in such regions is at least two orders of magnitude higher, and advantageously even higher, than in the bulk.

The processing should be such as to achieve in the bulk material of relatively low recombination velocity or rate for charge carriers, also sometimes described in the art as long lifetime for minority charge carriers, between the doped regions where the carriers normally flow in operation in the completed diode. In some instances, the desired structure is best achieved by growing an epitaxial layer of essentially intrinsic material of a desired shallow thickness on a more heavily doped substrate of a thickness that provides mechanical support and facilitates handling. In this case, carriers can be prevented from entering the more heavily doped substrate by interposing an epitaxial layer of insulating material, such as calcium fluoride. Alternatively, since the electron mobility is three times higher than the hole mobility, most of the current is transported by electrons. The substrate and top layer could hence be made out of semiconductor of different conductivity type, preferably an n-type top layer on a p-type bottom layer, to achieve substantially the same isolation effect. Alternatively there may be grown an "NIPI" structure as a super-lattice consisting of one or more periods of alternating n-type and p-type material, optionally separated by intrinsic layers. Various ways are known for growing such structures including chemical vapor deposition and molecular beam epitaxy.

Moreover, in production, advantageously there is used as a workpiece a semiconductor wafer of relatively large surface area in which are formed by common processing many elements for subsequent dicing into individual elements for separate packaging in the manner typical of current silicon device processing technology. However, in the interest of simplicity, the process is being described as though only a single element is being processed.

Figure 1B:
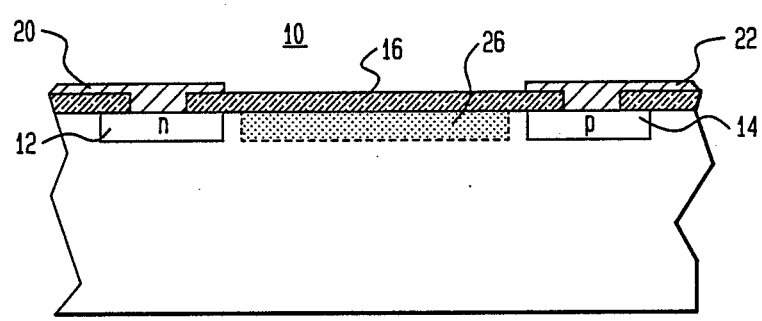

Referring now to FIG. 1B, the wafer 10 is shown after it has been treated to form a thermally-grown silicon oxide 16 over the front surface in a fashion to provide a low surface recombination velocity for minority carriers at the silicon oxide-silicon interface. This advantageously eliminates the original silicon surface of the wafer 10 which typically will have a high surface recombination velocity both because of the manner in which the element is prepared and also because bare silicon usually has a high recombination velocity at its surface. Such oxide layer would be unnecessary if a sufficiently low recombination velocity can be achieved at the silicon surface without it.

Contact windows are then opened in conventional fashion in the oxide 16 and a layer of a suitable contact metal, typically aluminum or an aluminum-silicon alloy, is deposited thereover and patterned to provide separate contact layers 20 and 22 to n-type region 12 and p-type region 14, respectively.

Figure 1C:
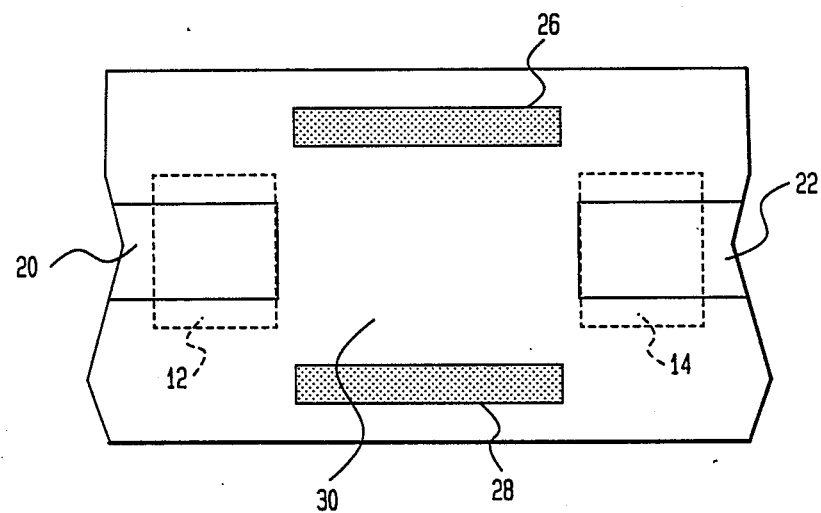
FIG. 1C shows a top view of the workpiece at a subsequent stage in such processing.

Referring now to FIG. 1C, there is shown a top view of wafer 10 with grooves 26 and 28 (shown stippled) advantageously etched in the top surface of the wafer 10 on opposite sides of a central portion 30 that lies directly between regions 12 and 14. Grooves 26 and 28 extend typically opposite a substantial length of central portion 30. The grooves advantageously extend in between 10 and 100 microns deep. Shallower or deeper grooves are feasible.

The grooves 26 and 28 are selectively then ion implanted to create damage in the regions of the bulk of the wafer 10 adjacent the grooves 26 and 28. Basically, the purpose of the grooves 26 and 28 is to facilitate damaging by ion implantation the interior of the wafer 10 selectively in two regions on opposite sides of the central portion 30 of the wafer 10. Such damage serves to increase the recombination rate or velocity of charge carriers selectively in such damaged regions. By use of such grooves, the implantation parameters can be made relatively non-critical and implantation energies of typically between 20 and 400 kiloelectron-volts and dosages typically between $10^{12}$ and $10^{15}$ ions per square centimeter become feasible for conveniently achieving the desired deep damage of the element.

It is desirable to achieve the appropriate damage to the desired depth selectively in the regions adjacent central portion 30 without significantly increasing the recombination velocity in the central portion 30 where the carriers normally flow. However, in one alternative version of this invention, regions 26 and 28 in FIG. 1C may be damaged (e.g., by ion implantation) without etching in these regions.

Moreover, to maintain such implanted regions in a state of high recombination velocity, it is important to avoid any subsequent treatment of the wafer 10 that would significantly anneal the damage done by the implantation, such as prolonged heating to high temperatures. However some implanted species, such as Ar, create damage that remains substantially intact even after annealing above 900 degrees C.

It should be apparent that since the role of the implanted ion is to damage the wafer 10 and create trapping centers where holes and electrons recombine readily, the implanted ion should be chosen to meet this role. A wide variety of ions are known to be suitable for this purpose including, for example, silicon, germanium, tin, oxygen, neon, argon, krypton, xenon, gold, and platinum.

After the wafer 10 has been suitably diced into individual elements, each individual element is typically bonded on its back surface, to a heat sinking support (not shown), and then separate leads (not shown) are bonded respectively to contact layers 20 and 22 to provide the diode terminals of the device.

It can be appreciated that in the absence of any magnetic field in the element, the application of a voltage between the leads to layers 20 and 22 to bias p-type region 14 positive with respect to n-type region 12 will result in a flow of electrons from region 12 to region 14 and of holes from region 14 to region 12 that recombine rather slowly because of the low recombination velocity in the central portion 30 in which the flow principally occurs.

However, if a magnetic field is applied that has a component in a direction upwards out of the plane of the paper with respect to FIG. 1C, both the holes and electrons flowing will be deflected by the Lorenz force upwards in the plane of the paper into the high recombination velocity material associated with groove 26 and there recombine and be extinguished. As a consequence, the resistance of the diode will increase because of the fewer charge carriers now flowing in the diode.

Various circuit arrangements are known for detecting the change in resistance in such a diode.

Figure 2:
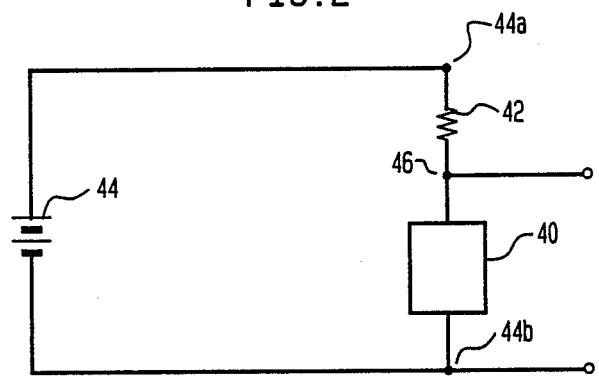
FIG. 2 shows a magnetodiode connected into a typical electrical circuit for use as a magnetic sensor.

Referring now to FIG. 2, there is shown a diode 40 of the kind described connected in series with a resistor 42 across terminals 44a and 44b of a voltage source 44 poled to bias the n-type region 12 negative and the p-type region 14 positive. The output voltage is derived by terminals 46 and 44b connected across the diode 40. Increases in the resistance of the diode 40 relative to the fixed resistance of resistor 42 will increase the fraction of the voltage supplied by the voltage source 44 that is available between terminals 46 and 44b.

As is described in the earlier identified paper, circuit arrangements may be devised including a pair of such diodes or a bridge of such diodes to increase the sensitivity.

It will be characteristic of the diode described that its characteristic will be symmetric from a direction of the magnetic field upwards from the plane of the paper to the direction downwards into the plane of the paper since in the latter instance, the flow of charge carriers will be deflected laterally in the opposite direction into the high recombination velocity region associated with groove 28.

If only one direction of magnetic field is to be sensed, only the appropriate one of the two damaged regions is needed.

In some instances even though only one direction is to be sensed, it may prove desirable to include both grooves as shown in FIG. 1C to confine the carriers to the central portion between the grooves, but to leave the material in the region of one groove undamaged. In such a case, it would be advantageous to passivate the silicon surface at such undamaged groove by a silicon oxide layer to reduce its trapping characteristics.

Figure 3A:
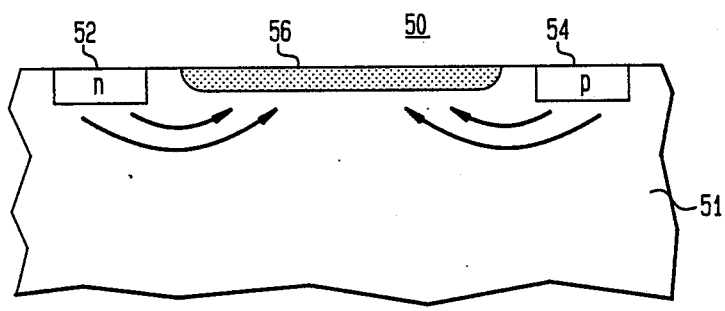
FIGS. 3A and 3B show cross-sectional and top views, respectively of another form of magnetodiode in accordance with the invention.
Figure 3B:
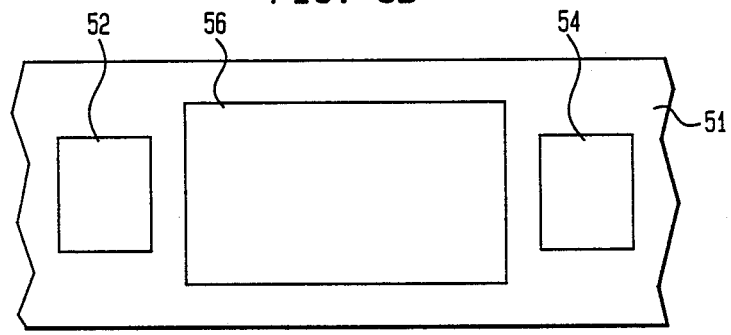

Referring now to FIGS. 3A and 3B, there are shown cross-sectional and top views, respectively, of a magnetodiode 50 in accordance with another embodiment of the invention. It comprises a monocrystalline silicon element 51 in which, as before, there are included at the top surface localized n-type and p-type doped regions 52 and 54, spaced apart by a high resistivity bulk portion of the element. At the top surface over the central portion between regions 52 and 54 there is also included a damaged region 56 (shown stippled in FIG. 3A), typically formed by ion implantation, preferably by a neutral ion that does not add free carriers to the silicon element but introduces only trapping centers to provide a surface region 56 of a high recombination velocity. This embodiment does not use a groove to increase the depth of the damage so that it is largely confined in a layer close to the surface. Although not shown, as before, separate contacts are provided to the doped regions 52 and 54 to serve as terminals of the diode.

In the diode 50, a magnetic field flowing upwards out of the plane of the paper with respect to FIG. 3A will deflect carriers flowing between regions 52 and 54 upwards into the damaged region 56 where they recombine and no longer are available for conduction. The diode 50 is useful primarily for sensing magnetic fields only of a single direction.

A disadvantage of the diode 50 is that the damaged region 56 may intercept appreciable carrier flow even in the absence of any applied magnetic field. Such interception at zero field may be kept to a small fraction of the whole by making the depth of the damaged region 56 much less than the depth of doped regions 52 and 54. This effect can be reached either by making damaged region 56 very shallow compared to regions 52 and 54 or by making the doped regions 52 and 54 very deep with respect to region 56. The latter is best achieved by forming the doped regions 52 and 54 by a deep diffusion process using dopants with large diffusion coefficients in silicon, such as boron, aluminum and phosphorus.

Figure 4:
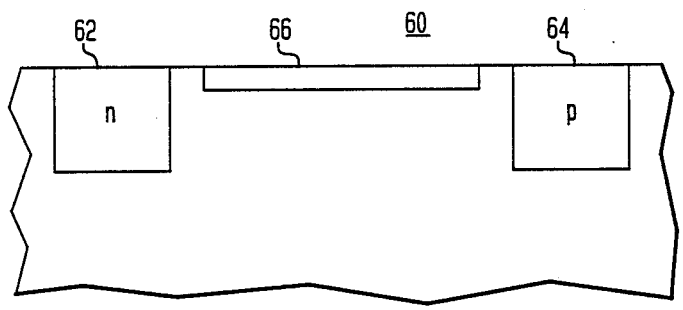
FIGS. 4, 5, 6 and 7 show cross-sectional views of magnetodiodes in accordance with other embodiments of the invention.

Referring now to FIG. 4, there is shown a cross-sectional view of a magnetodiode 60 essentially of the kind shown in FIG. 3A, but modified to include phosphorus-diffused n-type region 62 and aluminum-diffused p-type region 64, that are much deeper than the damaged region 66 that is intermediate between them. In this case, only a small fraction of the charge carriers flowing will be intercepted by damaged region 66 in the absence of an appropriate deflecting magnetic field, but a magnetic field of a direction to deflect the carriers upwards into the damaged region 66 can be sensed as an increase in the resistance of the diode.

Alternatively, if the damaged region 66 is made sufficiently deep in the diode 60 shown in FIG. 3A, it intercepts a major fraction of the carrier flow between the doped regions 52 and 54 in the absence of a magnetic field, a magnetic field in the direction to deflect carriers deeper and so below the damaged region can be sensed as a decrease in the resistance of the diode and a decrease in output voltage in a circuit of the kind shown in FIG. 2.

Figure 5:
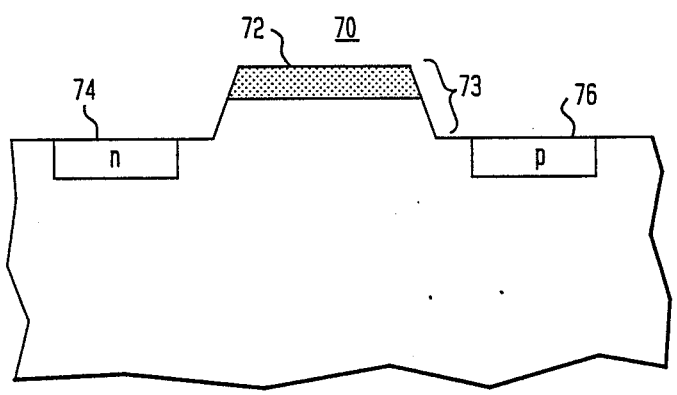

Referring now to FIG. 5, there is shown a magnetodiode 70 in accordance with another embodiment of the invention. Magnetodiode 70 is designed to keep low the intercepted flow in the absence of a magnetic field. A damaged region 72 of magnetodiode 70, which is centrally located, as were regions 56 and 66 in the earlier described magnetodiodes 50 and 60, is formed in a mesa 73 and above the level of doped n-type and p-type regions 74 and 76, respectively, so that carriers flowing there between are intercepted only when forced upwards by an appropriate deflecting magnetic field.

Figure 6:
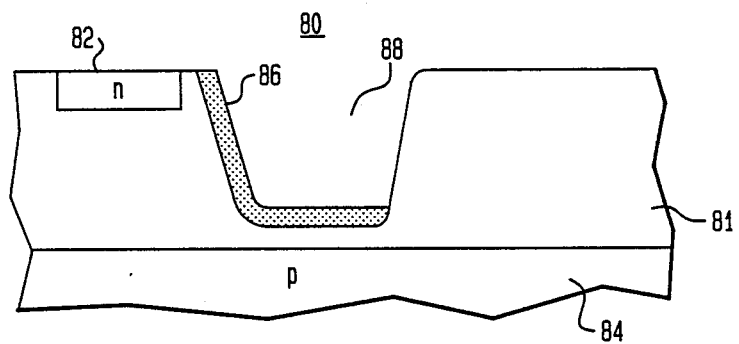

Referring now to FIG. 6, there is shown a magnetodiode 80 which employs a basically vertical structure and which is in accordance with another embodiment of the invention. A monocrystalline silicon wafer 81 whose bulk is of high resistivity and low recombination velocity, is provided at its top surface with a localized heavily doped n-type region 82 and at its bottom surface with a heavily doped p-type region 84. This structure can readily be formed either by growing epitaxially the high resistivity layer 81 on a heavily doped p-type substrate 84 or by a deep diffusion of aluminum in from the back surface to form region 84 of a high resistivity bulk semi-conductive wafer.

The top surface of wafer 81 contains a groove 88 along side of the region 82 and a damaged layer 86 is formed along a wall of this groove 88 as depicted. In the absence of an applied deflecting magnetic field, charge carriers readily flow vertically between regions 82 and 84 with little interception by layer 86. In a magnetic field that deflects the carriers laterally from left to right, carriers will be deflected laterally from vertical paths for interception by layer 86. This structure can be modified to respond also to the opposite direction of magnetic field by another groove on the opposite side of groove 82 with its own damaged layer to intercept carriers deflected laterally from right to left.

It can be appreciated that the structure can be reversed to use a localized doped p-type region on the top surface and an n-type layer on the lower surface.

Figure 7:
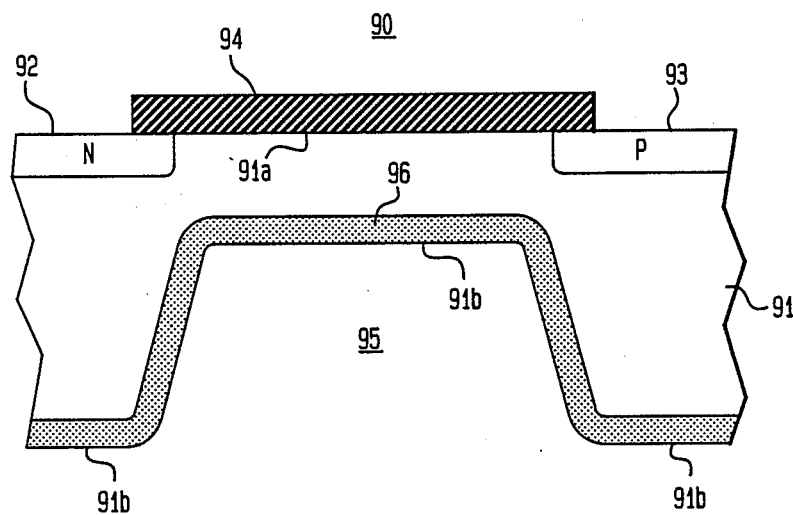

Referring now to FIG. 7, there is shown another magnetodiode 90 in accordance with another aspect of the invention. A high resistivity silicon wafer 91 initially of sufficient thickness for mechanical strength, typically 150–300 microns, is provided at a top surface 91a thereof with an n-type region 92 spaced apart from a p-type region 93 as described previously. The surface region between them is provided with a passivating layer 94 of silicon oxide to attain a low surface recombination rate there. A back surface 91b of the wafer 91 is selectively etched to thin the wafer 91 locally in the region between the doped regions 92 and 93 and to thus form a cavity 95. The thickness of the thinned region is preferably between 10 and 60 microns. The bottom surface 91b is now treated in any of the ways previously described to damage it (the region damaged being denoted as 96 and being shown stippled) to increase its surface recombination rate. Then when a magnetic field is applied normal to the plane of the drawing in FIG. 7, carriers flowing between the doped regions 92 and 93 are deflected either upwards or downwards depending on the direction of the field, and experience different recombination rates depending on the direction of deflection because of the difference in recombination rates at the two opposite surfaces. The resulting current accordingly is a measure of the direction and strength of the magnetic field being sensed. By thinning the central regions in this way there is avoided the flow of carriers deep in the wafer that would require large magnetic fields to deflect the carriers to a high recombination rate region.

The desired etching can be accomplished in various ways, wet chemicals, plasmas or ion etching. The end point of the etching can be controlled in known fashion, as by optical transmission either visible or infrared. In some instances, it may be feasible to control etching selectively by use of a chemical etch that etches selectively based on doping level in the wafer, after doping the wafer appropriately.

It can readily be appreciated that the specific embodiments described are merely illustrative. Various possible modifications will be apparent to the worker in the art without departing from the spirit and scope of the invention. For example, in some instances, it may be desirable to prevent the holes and electrons, when flowing, from flowing too deeply from the high recombination region because of the larger magnetic fields needed to deflect the carriers into the high recombination region. This can be done by thinning the bottom side of the wafer selectively in the region between the doped regions where the carriers normally flow, as was described in the embodiment shown in FIG. 7, to keep the central region thin. This technique for example would be particularly applicable to the embodiments shown in FIGS. 1A, 1B and 1C, FIGS. 3A and 3B, FIG. 4 and FIG. 5. In these embodiments, the bottom side would then typically be provided with a passivating layer to keep its recombination rate low. Alternatively, other arrangements can be used to keep the effective thickness of the wafer small.

Still further, various other semiconductor materials may be substituted for silicon so long as the material has a suitably high mobility for free charge carriers and exhibits a suitably strong Hall effect. Germanium, indium antimonide, gallium arsenide, and indium arsenide are examples of other possible semiconductors. Additionally, various other techniques may be used for forming regions of high recombination velocity including the introduction of trapping centers, such as gold or platinum by localized diffusions either from surface deposited layers or vapor-solid masked diffusions, as is well known in semiconductor technology. Still other alternatives to produce the high recombination velocity portions include exposure of the silicon surface to a plasma, or to a low energy beam, of ions or of neutral particles. If desired, the plasma or ion beam can be used simultaneously to etch or mill the grooves. Various chemical treatments also can be used to roughen the surface and increase its carrier trapping efficiency. Absence of a silicon oxide surface passivating layer will alone increase the surface recombination velocity in silicon. Additionally, it will be recognized that since it may be impractical to utilize essentially intrinsic material for the bulk of the semiconductor element, the bulk may be doped either slightly p-type or n-type so long as the doping level is sufficiently less than that in the localized n-type and p-type injecting regions that the carriers injected into the bulk from such regions constitute the major portion of the carriers flowing in the bulk during operation as a sensor. Moreover, it is feasible, as is known, to include layers of high magnetic permeability, such as ferrite material, deposited on the semiconductive element or otherwise positioned in order to concentrate the magnetic field being sensed in the active region of the semiconductive element to increase the deflecting effect of the magnetic field. Still further, while it differs from standard integrated circuit processing, the damage to regions 26 and 28 of FIG. 1C can alternatively be caused by sandblasting rather than ion implantation. In this case, a relatively thick layer of photoresist is used to protect the regions outside regions 26 and 28 from a stream of high velocity particles impinging on the wafer. These particles are nominally sized in the range of 1–10 microns, and are typically composed of silicon carbide, aluminum oxide, or diamond. Alternatively a mask, typically of a metal such as molybdenum, may be positioned over the sample with holes in it corresponding to regions 26 and 28. After aligning the mask with the sample, the mask assists in protecting the device outside regions 26 and 28 from the sandblasting particles.

It can also be appreciated that in some instances for circuit reasons, there may be a preferred a magnetic sensor in which a magnetic field being sensed serves to decrease rather than increase the resistance between a pair of leads. Such a sensor may be obtained by a silicon device geometry in which the absence of an applied magnetic field, current flow between a pair of spaced heavily doped zones is appreciably intercepted by a region of high recombination velocity in the direct path of such flow, such as the device shown in FIGS. 3A and 3B. This device is then used to sense a magnetic field flowing downwards into the plane of the paper with respect to FIG. 3A to deflect carriers flowing between regions 52 and 54 downwards away from the damaged region 56 so that none of the injected carriers complete their travel between regions 52 and 54.

The embodiments of the invention in which an exclusive property or privilege is claimed are defined as follows:

1. A process for forming a magnetic sensor comprising the steps of:

preparing a semiconductive monocrystalline element of relatively high resistivity and low recombination velocity;

forming spaced apart on a surface of said element a pair of localized regions of relatively low resistivity and of opposite conductivity types;

forming at least one groove on said surface along a side of the portion of said surface that extends directly between said localized regions; and implanting ions selectively in the element in the region adjacent said groove for damaging the crystal lattice in the surrounding portion of the groove for making such portion of high recombination velocity.

2. The process of claim 1 in which there are formed grooves on said surface along the two opposite sides of the portion of said surface that extend directly between said localized regions and ions are implanted selectively in the regions adjacent the grooves making such regions of high recombination velocity.

* * * * *